United States Patent
Lu et al.

(10) Patent No.: US 10,139,945 B2
(45) Date of Patent: Nov. 27, 2018

(54) TOUCH PANEL, A DISPLAY APPARATUS, A METHOD FOR MANUFACTURING THE SAME AND A METHOD FOR DRIVING THE SAME

(71) Applicant: BOE Technology Group Co., Ltd., Beijing (CN)

(72) Inventors: Jianing Lu, Beijing (CN); Ling Shi, Beijing (CN); Long Wang, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 15/126,765

(22) PCT Filed: Sep. 18, 2015

(86) PCT No.: PCT/CN2015/089968
§ 371 (c)(1),
(2) Date: Sep. 16, 2016

(87) PCT Pub. No.: WO2016/179937
PCT Pub. Date: Nov. 17, 2016

(65) Prior Publication Data
US 2017/0108979 A1     Apr. 20, 2017

(30) Foreign Application Priority Data

May 12, 2015  (CN) .......................... 2015 1 0239477

(51) Int. Cl.
*G06F 3/045*     (2006.01)
*G06F 3/041*     (2006.01)
(Continued)

(52) U.S. Cl.
CPC ............ *G06F 3/0416* (2013.01); *G06F 3/041* (2013.01); *G06F 3/044* (2013.01); *G06F 3/0412* (2013.01);
(Continued)

(58) Field of Classification Search
CPC ....... G06F 3/0412; G06F 3/044; G06F 3/0416
See application file for complete search history.

(56) References Cited

U.S. PATENT DOCUMENTS

2012/0249454 A1* 10/2012 Teraguchi ............. G06F 3/0412
345/173
2014/0192019 A1*  7/2014 Fukushima ........... G06F 3/0412
345/174
(Continued)

FOREIGN PATENT DOCUMENTS

CN        203054788 U      7/2013
CN        204204861 U      3/2015
(Continued)

OTHER PUBLICATIONS

International Search Report and Written Opinion, including English translation of Box No. V of the Written Opinion, for International Application No. PCT/CN2015/089968, dated Feb. 5, 2016, 12 pages.

*Primary Examiner* — Nan-Ying Yang
(74) *Attorney, Agent, or Firm* — Westman, Champlin & Koehler, P.A.

(57) ABSTRACT

The present disclosure provides an OLED touch panel, comprising: a substrate; a cathode and an anode, arranged on the substrate, wherein the cathode comprise a plurality of sub-cathodes; and at least one touch driving electrode, arranged on a same layer as the anode and separated from the anode, wherein the touch driving electrode is disposed to be intersected with the sub-cathodes; wherein the OLED touch panel is configured to, at a displaying phase, apply a driving signal for displaying on the cathode or the anode, so as to drive an OLED device, and applying, at a touching phase, a driving signal for touching on the touch driving electrode, so that at least a part of the sub-cathodes are operated as touch sensing electrodes, to output a touch sensing signal. The present disclosure also provides a display apparatus comprising the above OLED touch panel and a method for driving the same. The present disclosure uses the anode and cathode layer of the OLED device as an (Continued)

electrode layer of the touch sensor. Thus, by performing the touching and displaying of the touch display in a time sharing manner, the electrode layer can be omitted, and the thinner touch display can be manufactured.

16 Claims, 7 Drawing Sheets

(51) Int. Cl.
  *G06F 3/044* (2006.01)
  *H01L 27/32* (2006.01)
  *H01L 51/52* (2006.01)

(52) U.S. Cl.
  CPC ........ *H01L 27/323* (2013.01); *H01L 27/3265* (2013.01); *H01L 51/5209* (2013.01); *H01L 51/5225* (2013.01); *G06F 2203/04103* (2013.01)

(56) References Cited

U.S. PATENT DOCUMENTS

2015/0169121 A1* 6/2015 Yao .................. G06F 3/0412
                                                    345/174
2016/0327835 A1* 11/2016 Xie .................. G06F 3/0412

FOREIGN PATENT DOCUMENTS

| CN | 104793804 A | 7/2015 |
| CN | 204650473 U | 9/2015 |
| KR | 10-2013-0011673 A | 1/2013 |

* cited by examiner

TOUCH PANEL, A DISPLAY APPARATUS, A METHOD FOR MANUFACTURING THE SAME AND A METHOD FOR DRIVING THE SAME

CROSS-REFERENCE TO RELATED APPLICATION(S)

This application is a Section 371 National Stage application of PCT/CN2015/089968, filed on 18 Sep. 2015, entitled "A TOUCH PANEL, A DISPLAY APPARATUS, A METHOD FOR MANUFACTURING THE SAME AND A METHOD FOR DRIVING THE SAME, which has not yet published, and claims priority to Chinese Application No. 201510239477.X filed on May 12, 2015, the contents of which are incorporated herein by reference in their entirety.

TECHNICAL FIELD

The disclosure relates to a field of display technology, and more particularly, to a touch panel, a display apparatus, a method for manufacturing the same and a method for driving the same.

BACKGROUND

An Active Matrix/Organic Light Emitting Diode (AMOLED) is an active matrix/organic light emitting diode panel. Compared with a traditional liquid crystal panel, the AMOLED panel has become a hot spot due to its advantages such as a fast response, a high brightness, a low power consumption, a good view, being capable of flexible display and the like. Currently, the display of the AMOLED generally utilizes an embedded on-cell touch technology. Compared with an on-cell touch technology, an AMOLED embedding technology becomes more and more popular, because it can make a display module thinner.

The conventional AMOLED embedding scheme generally installs a sensor bellow an encapsulating substrate, thus it can only be applied to a glass-type encapsulation. If the OLED device uses a thin film encapsulation technology, the conventional AMOLED embedding scheme cannot be applied.

Furthermore, an alternative option is to combine the sensor with the OLED device, which can not only make the embedded touch device thinner, but also get rid of the limitation of encapsulating schemes.

With respect to a conventional method of setting a touch panel above a liquid crystal panel for using, a research on integrating functions of the touch panel with the liquid crystal panel becomes more and more popular. The methods for integrating the touch panel with the liquid crystal panel may comprise an "In-cell embedding" method and an "On-cell embedding" method. The in-cell embedding method refers to a method of embedding the functions of the touch panel into liquid crystal pixels. The on-cell embedding method refers to a method of embedding the functions of the touch panel between a color filter substrate and a polarizing plate. The in-cell embedded touch panel and the on-cell embedded touch panel are both grouped into an embedded touch panel, and differ in that the touch sensor in the in-cell embedded touch panel is disposed inside a TFT of a TFT LCD, whereas the touch sensor in the on-cell embedded touch panel is disposed at the back of the color filter.

The conventional in-cell embedded integration method is used for integrating the TFT-LCD and the touch sensor. Thus, there is a need for an embedded integrating method for the OLED device and the touch sensor.

SUMMARY

The disclosure provides a method for integrating an OLED device with a touch sensor.

According to an aspect of the disclosure, an OLED touch panel is provided, which may comprise: a substrate; a cathode and an anode, arranged on the substrate, wherein the cathode comprise a plurality of sub-cathodes; and at least one touch driving electrode, arranged on a same layer as the anode and separated from the anode, wherein the touch driving electrode is disposed to be intersected with the sub-cathodes; wherein the OLED touch panel is configured to, at a displaying phase, apply a driving signal for displaying on the cathode or the anode, so as to drive an OLED device, and applying, at a touching phase, a driving signal for touching on the touch driving electrode, so that at least a part of the sub-cathodes are operated as touch sensing electrodes, to output a touch sensing signal.

According to another aspect of the disclosure, a method for manufacturing an OLED touch panel is provided, which may comprise: forming a transistor structure on an substrate; forming an anode by patterning; forming at least one touch driving electrode in the same layer as the anode, wherein the anode is separated from the touch driving electrode; forming an OLED active layer on the anode in an area for an OLED device on the touch panel, wherein the anode is connected to a source/drain of the transistor structure; and forming a cathode comprising a plurality of sub-cathodes, wherein the cathode is insulated from the touch driving electrode by an insulating layer, and the sub-cathodes is disposed to be intersected with the touch driving electrode.

According to still another aspect of the disclosure, a display apparatus comprising the above OLED touch panel is provided.

According to yet another aspect of the disclosure, a method for driving a display apparatus is provided, which may comprise: applying, at a displaying phase, a driving signal for displaying on the cathode or the anode, so as to drive the OLED device; and applying, at a touching phase, a driving signal for touching on the touch driving electrode, so that at least a part of the sub-cathodes are operated as touch sensing electrodes, to output a touch sensing signal.

BRIEF DESCRIPTION OF THE DRAWINGS

Reference will now be made to the accompanying drawings for illustrating the embodiments of the disclosure, wherein like reference numerals refer to the like elements throughout, in which.

DETAILED DESCRIPTION

According to embodiments of the present disclosure, by utilizing an anode and cathode layer of an OLED device as an electrode layer of a touch sensor, i.e. patterning the cathode as a sensing electrode Rx of a sensing layer of the touch sensor and using at least one touch driving electrode disposed at the same layer as the anode as the driving electrodes Tx of the touch sensor, and then performing a OLED displaying operation and a touch sensing operation in a time shared driving manner, the touching and displaying operation of such integrated embedded touch display can be achieved. According to the embodiments of the present disclosure, an OLED in-cell touch display apparatus can be formed, by integrating the OLED display device with the touch sensor.

In the disclosure, by utilizing the anode and the cathode layer of the OLED device as an electrode layer of the touch sensor, i.e. patterning the cathode as a sensing electrode Rx of a sensing layer of the touch sensor and using at least one touch driving electrode disposed at the same layer as the anode as the driving electrodes Tx of the touch sensor, and driving these electrodes in a time shared manner, the touching and displaying operation of the touch panel can be achieved. Thus, the display apparatus and the touch apparatus are integrated together, without affecting a displaying resolution and a luminous efficiency of the display significantly. Furthermore, a thinner touch display can be manufactured due to the absence of the electrode layer, which is not only applicable to a rigidity OLED display device, but also to a flexible OLED display device.

According to an aspect of the disclosure, an OLED touch panel can comprise: a substrate; a cathode and an anode, arranged on the substrate, wherein the cathode comprise a plurality of sub-cathodes; and at least one touch driving electrode, arranged on a same layer as the anode and separated from the anode, wherein the touch driving electrode is disposed to be intersected with the sub-cathodes; wherein the OLED touch panel is configured to, at a displaying phase, apply a driving signal for displaying on the cathode or the anode, so as to drive an OLED device to emit lights, and applying, at a touching phase, a driving signal for touching on the touch driving electrode, so that at least a part of the sub-cathodes are operated as touch sensing electrodes, to output a touch sensing signal.

Figure 1:
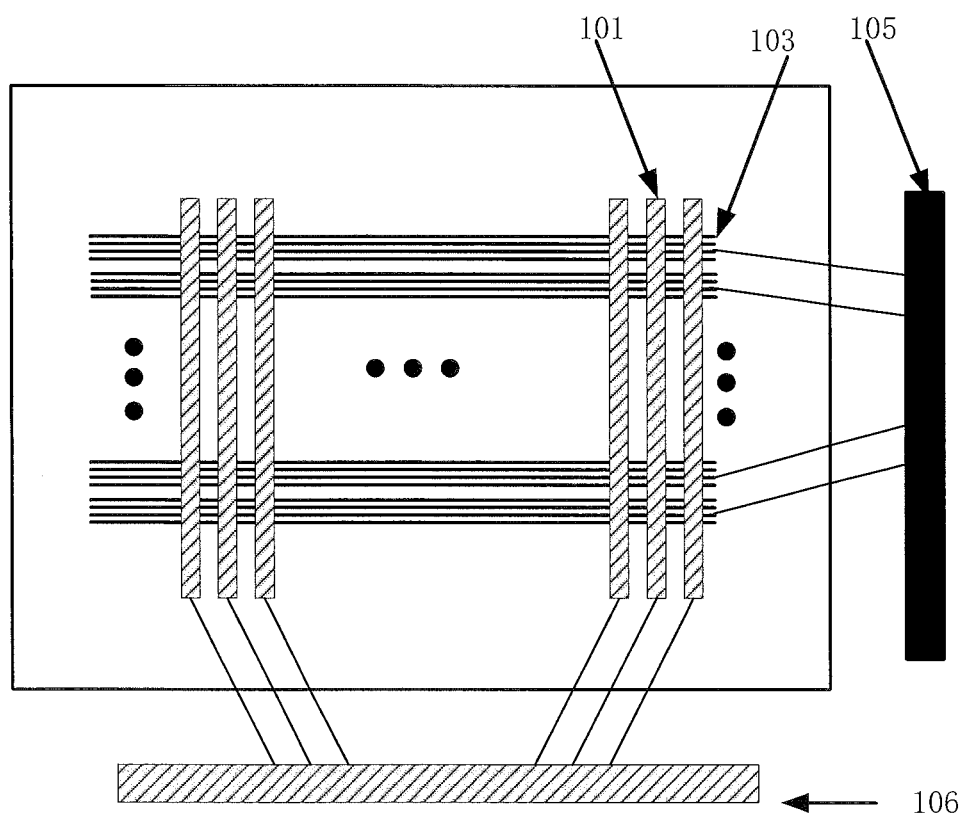
FIG. 1 is a plan view illustrating a structure of a touch panel according to the embodiment of the disclosure.

FIG. 1 is a plan view illustrating a structure of a touch panel according to the embodiment of the disclosure. As shown in FIG. 1, in a specific implementation, the touch panel may comprise: a substrate, a cathode and an anode 101, arranged on the substrate, wherein the cathode may comprise a plurality of sub-cathodes; and at least one touch driving electrode 103, arranged on a same layer as the anode and separated from the anode, wherein the touch driving electrode is disposed to be intersected with the sub-cathodes. At a displaying phase, a driving signal for displaying is applied on the cathode or the anode, so as to drive an OLED device to emit light. At a touching phase, at least a part of the sub-cathodes on the OLED touch panel are operated as touch sensing electrodes, so as to output a touch sensing signal. The touch sensing electrode 101 is patterned to distinguish different touch sensing areas. The touch driving electrode 103 and the touch sensing electrode may be drawn to a connecting terminal for the touch driving electrode 105 and a connecting terminal for the touch sensing electrode 106 respectively, and then provided with driving signals by connecting a driving IC. As shown in FIG. 1, the touch driving electrode 103 may be formed with a plurality of hollow areas. For example, the touch driving electrode 103 may be in a shape having slots arranged in parallel, which can further improve a transmittance.

With respect to a touching phase of the OLED touch panel, a driving signal for touching is applied on the touch driving electrode, and at least a part of the sub-cathodes are operated as touch sensing electrodes, to output a touch sensing signal. The touch driving electrode 103 and touch sensing electrode 101 may cover the whole touch area by crossing with each other. In particular, the touch sensing electrode and the touch driving electrode 103 may be perpendicularly disposed, so as to cover the whole touch area. The driving signal for touching can be applied on the touch driving electrode 103. When a certain area is touched by a finger, the touch sensing electrode of the touched area may output an electrical signal which is processed (such as, being integrated or amplified and filtered) and then sent to a touching IC. The touching IC will calculate a coordinate of the touched point, thus, a touching operation is finished. With respect to a displaying phase of the OLED touch panel, a driving signal for displaying is applied on the cathode 101 or the anode 102, so as to drive an OLED device. By performing the touching operation and displaying operation alternatively in a time sharing manner, i.e. by using the interaction between the patterned cathode which is used in a timing sharing manner and the anode of the OLED device or the touch driving electrode, the displaying operation or the touching operation can be realized.

Figure 2:
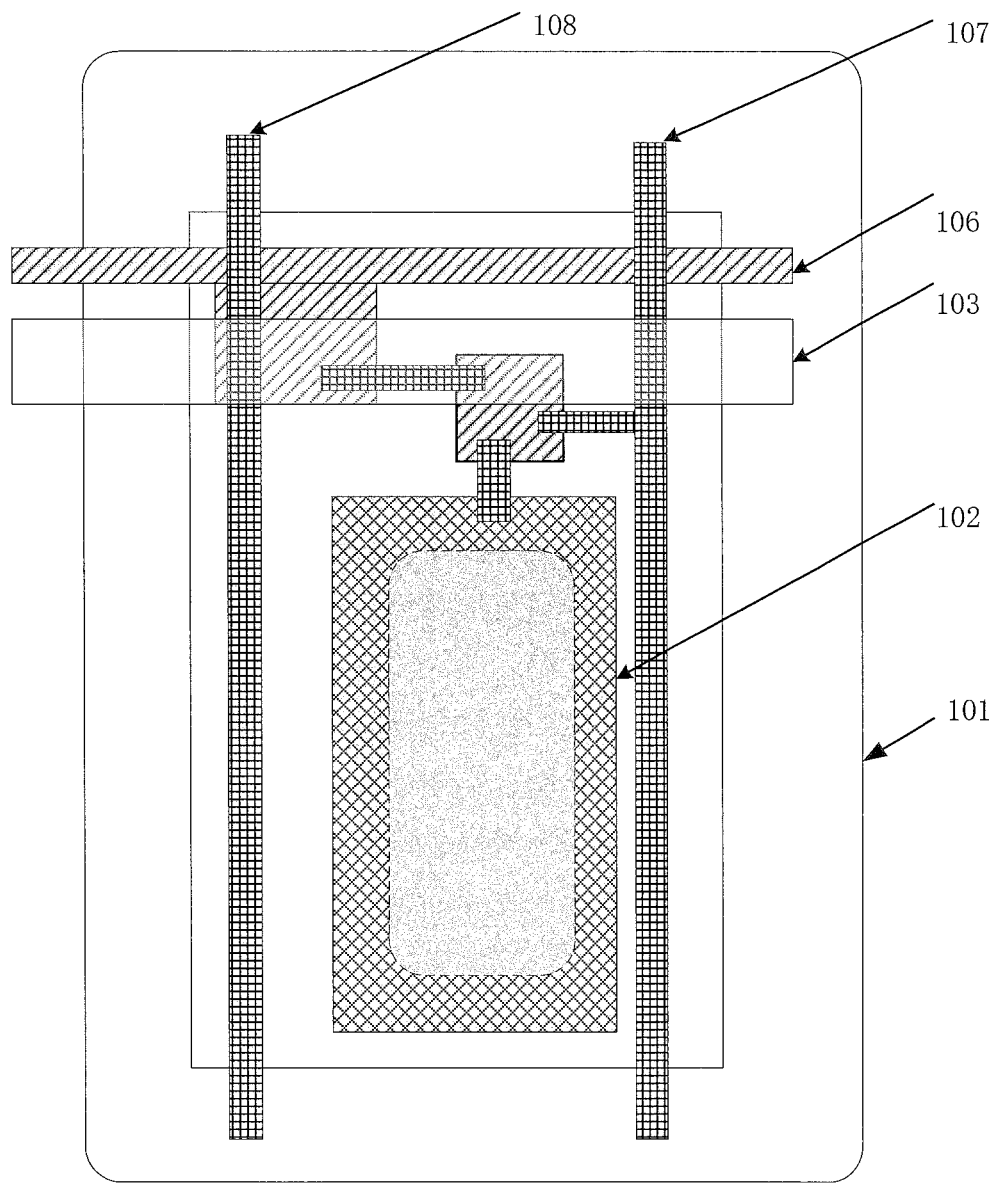
FIG. 2 is a design for an electrode in pixels.

FIG. 2 is a designing diagram for the electrodes in the pixels of the OLED touch panel according to the embodiments of the disclosure. As shown in FIG. 2, in the pixel structure, the touch driving circuit 103 is formed in a same layer as the anode electrode layer, and independent from the anode electrode layer. In particular, the anode electrode layer may be an ITO anode layer. The touch driving electrode 103 may be disposed over a pixel driving device. The touch driving electrodes in each line can be connected with each other, so as to form a strip shaped structure. Since an area of the touched point by a finger is relatively large, in order to reduce an influence on the opening ratio of the pixels and reduce a resistance of the touch driving electrode without affecting the touching resolution, the touch driving electrodes (each group has 5~15 touch driving electrodes) are connected in parallel at edges of the display area, which may lead to the touch driving electrodes being formed in a broad strip shaped structure. In particular, the ITO anode layer can be patterned to form a strip shaped anode structure 102 and a touch driving electrode structure 103. The cathode layer 101 can be disposed over the whole area. Then, the cathode area is patterned to form a strip shaped cathode structure which is perpendicular with the strip shaped anode structure. As shown in FIG. 2, the illustrated structure may further comprise a gate line 106, a Vdd line 107 and a data line 108.

Figure 3:
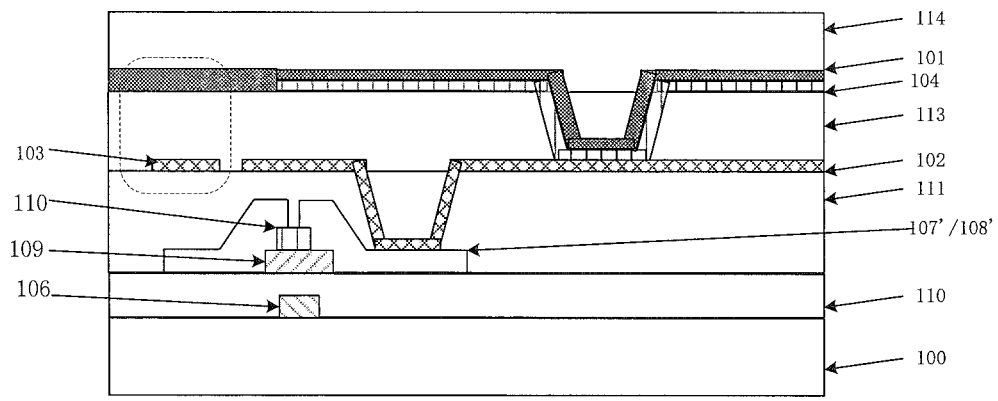
FIG. 3 is a cross section view illustrating a structure of a pixel electrode.

FIG. 3 is a cross section view of the pixel electrode structure according to the embodiments of the disclosure. As shown in FIG. 3, a gate 106 is firstly formed on the substrate 100. The substrate can be made of a glass or a polyimide. After forming the gate 106, a gate insulating layer 10 is formed, such as a gate oxide. The gate oxide may be an insulating material formed by processes such as LPCVD, PECVD, HDPCVD, UHVCVD, MOCVD, MBE, ALD, evaporation, (magnetic) sputtering and the like. The gate oxide may be made of a material such as a silica or a high k material, etc. Subsequently, an indium gallium zinc oxide channel region 109, an etching stopping layer 110, a gate and a drain (107'/108') are formed, and the resultant structure is covered by using a PLN&PVX insulating layer 111. A contacting through hole is etched at a contact of the source/drain 107'/108'. Then, the ITO anode electrode layer 102 is deposited. The touch driving electrode and the ITO anode are both disposed at this layer. In preparing the electrodes of the touch sensor, the touch driving electrode of the touch sensor is implemented with an individual ITO electrode in the pixel electrode, as shown by 103 on the left of FIG. 3. With respect to the part in which the OLED device is formed, by masking and etching, an OLED light emitting layer 104 can be deposited on the anode area (represented by 103 on the right of FIG. 3) being used as the anode of the OLED. Furthermore, the cathode layer 101 may be deposited on the resultant structure. In the preparing procedure, the cathode is patterned as the sensing electrode Rx of the sensing layer of the touch sensor, which is configured to divide the sensing area. Furthermore, there may be an insulating layer 113 between the touch driving electrode 103 and the touch sensing electrode 101. At the touching phase, a capacitor will be generated between each of these two electrodes and the hand. A change of a capacitance of the capacitor will lead to a change of a current. From which, the touched position can be determined. Finally, the resultant structure is encapsulated with a thin film encapsulation layer 114.

In this manner, in the area for the OLED device on the right of FIG. 3, the OLED device according to the disclosure is formed. The OLED device comprises the cathode layer 101, the anode layer 102 and the OLED active layer 104 being sandwiched between the anode and the cathode. With respect to the area for the touch sensor on the left of FIG. 3, the ITO electrode is used as the touch driving electrode 103 of the touch sensor, and the patterned cathode is used as the touch sensing electrode of the touch sensor. Thus, the insulating layer PDL being sandwiched between the touch driving electrode and the touch sensing electrode, the touch driving electrode and the touch sensing electrode Rx constitute a touch sensing capacitor together.

Figure 4:
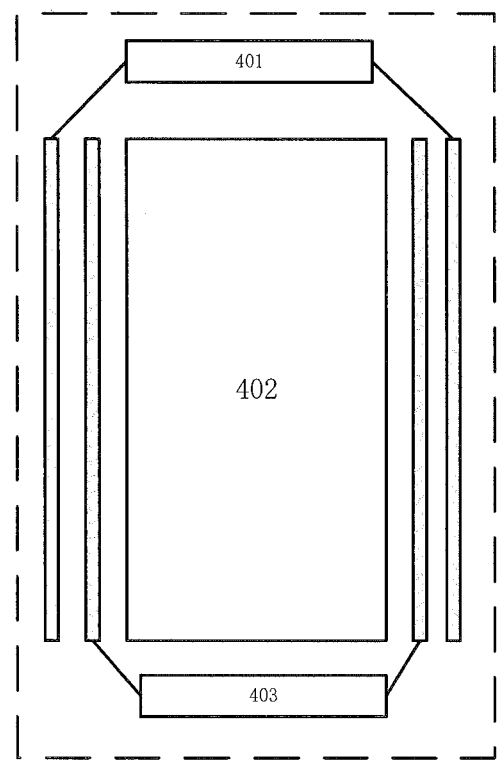
FIG. 4 is a diagram illustrating a time shared pixel displaying and touch sensing operation on the embedded active matrix organic light emitting diode (AMOLED) display according to the disclosure in detail.

FIG. 4 is a diagram illustrating the time shared pixel displaying and touch sensing operation of the touch panel in the disclosure in detail. As shown in FIG. 4, when it is required to perform the touch sensing operation, the touch sensing electrode and the touch driving electrode disposed at both sides of the pixel area 402 are driven by the driving apparatus for the touch sensor 401, respectively. When it is required to perform the light emitting operation of the OLED device, the anode and the cathode disposed at both sides of the pixel area are driven by the driving apparatus for the OLED 403, respectively.

Figure 5:
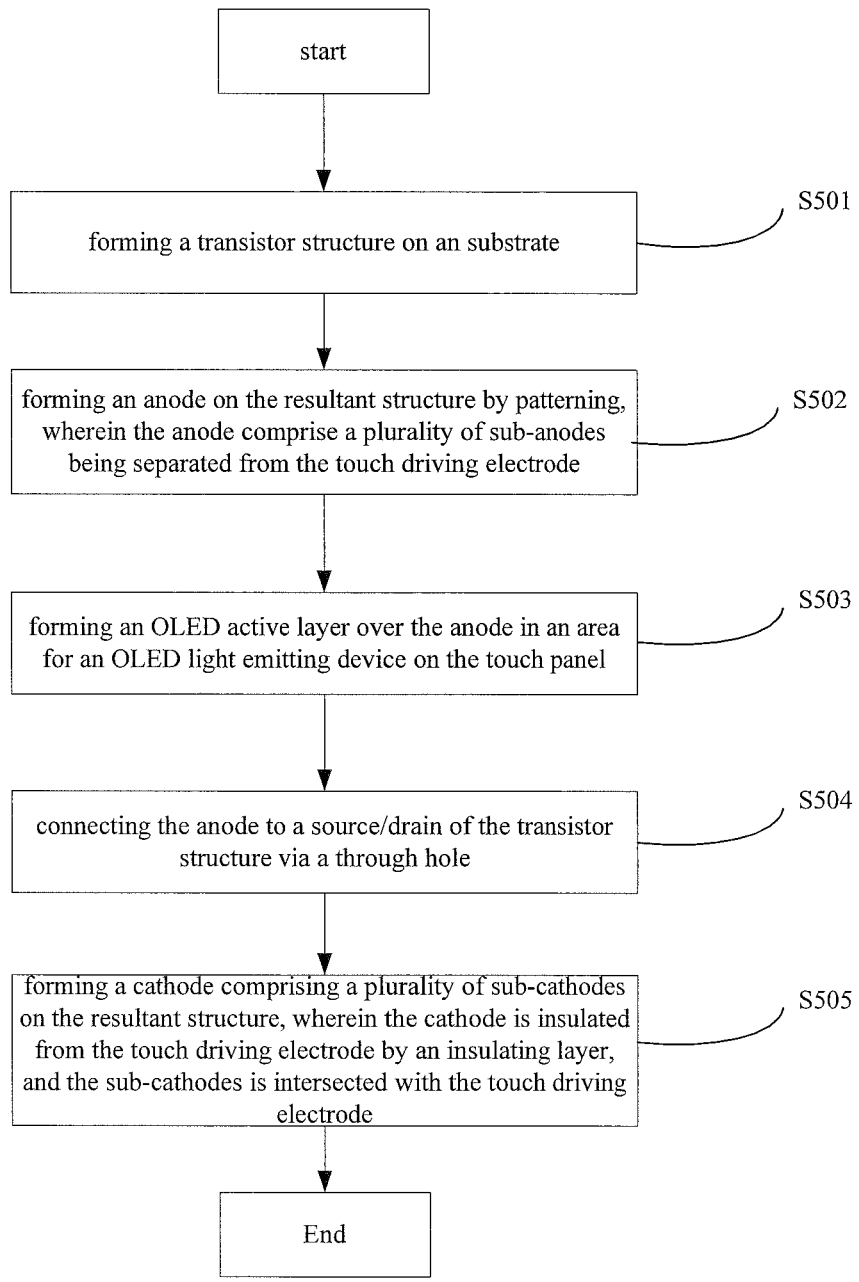
FIG. 5 is a flow chart illustrating a method for manufacturing the OLED touch panel according to the embodiments of the disclosure.

FIG. 5 is a flow chart illustrating a method for manufacturing the OLED touch panel according to the embodiments of the disclosure. As shown in FIG. 5, the method for manufacturing the OLED touch panel may comprise: forming a transistor structure on an substrate (S501); forming an anode and a touch driving electrode (S502) by patterning, on the transistor structure, wherein the anode is in the same layer with the touch driving electrode, but separated from it; forming an OLED active layer over the anode in an area for an OLED light emitting device on the touch panel (S503); connecting the anode to a source/drain of the transistor structure via a through hole (S504); and forming a cathode comprising a plurality of sub-cathodes (S505), wherein the cathode is insulated from the touch driving electrode by an insulating layer, and the sub-cathodes is disposed to be intersected with the touch driving electrode.

Figure 6:
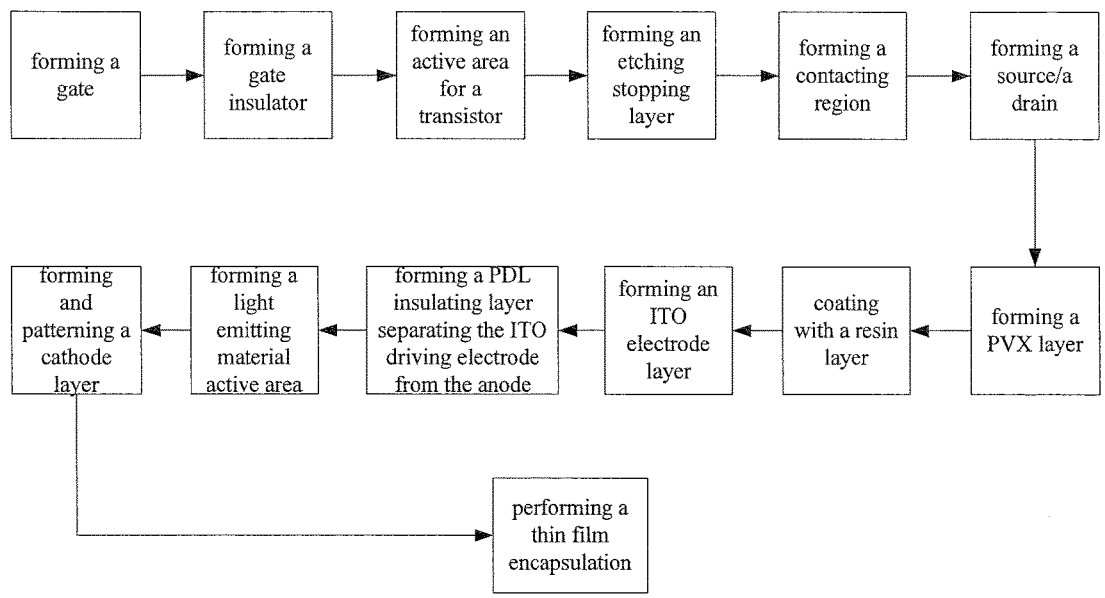
FIG. 6 is a process flow illustrating a method for manufacturing the embedded active matrix organic light emitting diode (AMOLED) display according to the embodiments of the disclosure.

FIG. 6 is a flow chart illustrating a process of a method for manufacturing the display apparatus according to the embodiments of the disclosure. As shown in FIG. 6, the method may comprise: forming a gate; forming a gate insulator; forming an active area for a transistor; forming an etching stopping layer; forming a contacting region; forming a source/a drain; forming a PVX layer; coating with a resin layer; forming an ITO electrode layer; forming a PDL insulating layer, which may separate the ITO driving electrode from the anode; forming a light emitting material active area; forming and patterning a cathode layer; and performing a thin film encapsulation.

In particular, after forming the OLED device, the insulating layer is firstly coated on the resultant OLED device; then, the ITO anode layer is deposited. The ITO anode layer is patterned as the ITO driving electrode and the ITO anode which are separated from each other and used as the touch driving electrode of the touch sensor and the anode of the OLED device respectively. Subsequently, a pixel definition layer PDL is deposited, and an opening is formed on the PDL part disposed above the ITO anode. Next, the light emitting layer material EL is evaporated on the opening of the PDL, so as to connect to the underlying ITO anode. Then, the cathode layer is deposited and patterned as a strip shaped structure being perpendicular with the ITO anode, wherein the patterned cathode is used as the touch sensing electrode of the touch sensor and the cathode of the OLED device.

In particular, a common process for manufacturing the OLED device is firstly performed, i.e. the gate, the gate insulator, the active area, the etching stopping layer ESL, the contacting layer CNT, the source/the drain and the PVX insulator are formed on the substrate in sequence. Then, a resin is coated to form a smoothing layer, so as to ensure that the subsequent processes can be performed on a smooth substrate. Subsequently, the ITO layer is sputtered and then patterned as the touch driving electrode and the ITO anode, which are insulated from each other and used as the touch driving electrode of the touch sensor and the anode of the OLED device respectively. Next, the PDL layer is formed, and the opening is formed on the pixel definition layer PDL disposed above the ITO anode. Then, the light emitting material EL is evaporated on the PDL opening, so as to connect to the underlying ITO anode. Next, the cathode layer is deposited and patterned. The cathode is evaporated as being in a strip shaped structure by the fine metal mask (FMM), and then led from an edge of the display area to connect the driving IC. The patterned cathode may be used as the touch sensing electrode of the touch sensor and the cathode of the OLED device simultaneously. Finally, the thin film encapsulation (TFE) is performed on the whole display apparatus, so as to keep the OLED device from water or oxygen erosion.

Figure 7:
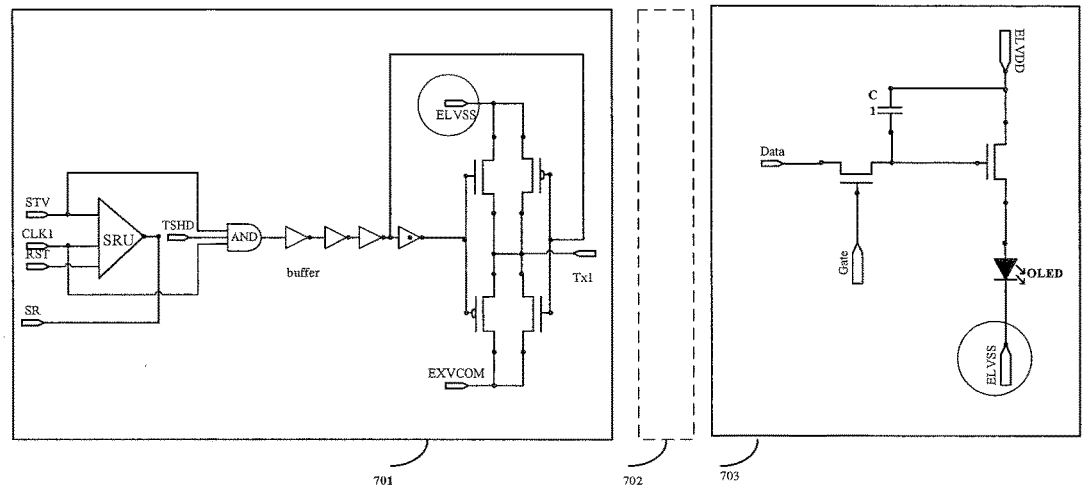
FIG. 7 is a structural diagram illustrating a display panel of a touch panel according to the embodiment of the disclosure.

FIG. 7 is a structural diagram illustrating an OLED touch display panel according to the embodiment of the disclosure. As shown in FIG. 7, a driving gate array of the touch sensor, a driving gate array and a pixel structure circuit of the display apparatus are arranged in wards from the edge of the display panel in sequence. This can ensure a match of the touch sensor apparatus and the display apparatus, wherein the gate array of the touch sensor may connect to the circuit in the pixel structure at the ELVSS shown in FIG. 7.

In particular, as shown in FIG. 7, the driving method which is applicable to the touch display panel of FIG. 7 may comprise: transmitting a driving signal for displaying for the OLED device and the driving signal for touching for the touch sensor to a transmission gate in a time sharing manner; when the displaying operation of the OLED device is performed, outputting the driving signal for displaying and applying the driving signal for displaying to the cathode or anode of the OLED device, by the transmission gate; and when the touching operation of the touch sensor is performed, outputting the driving signal for touching and transmitting the driving signal for touching to the touch driving electrode of the touch sensor, by the transmission gate. At least one part of the cathode of the OLED device is used as the touch sensing electrode, and when a touching motion is sensed by the touch sensing electrode, the touch sensing electrode, the touch driving electrode and the touch driving circuit will be cooperated with each other to generate a sensing signal.

Figure 8:
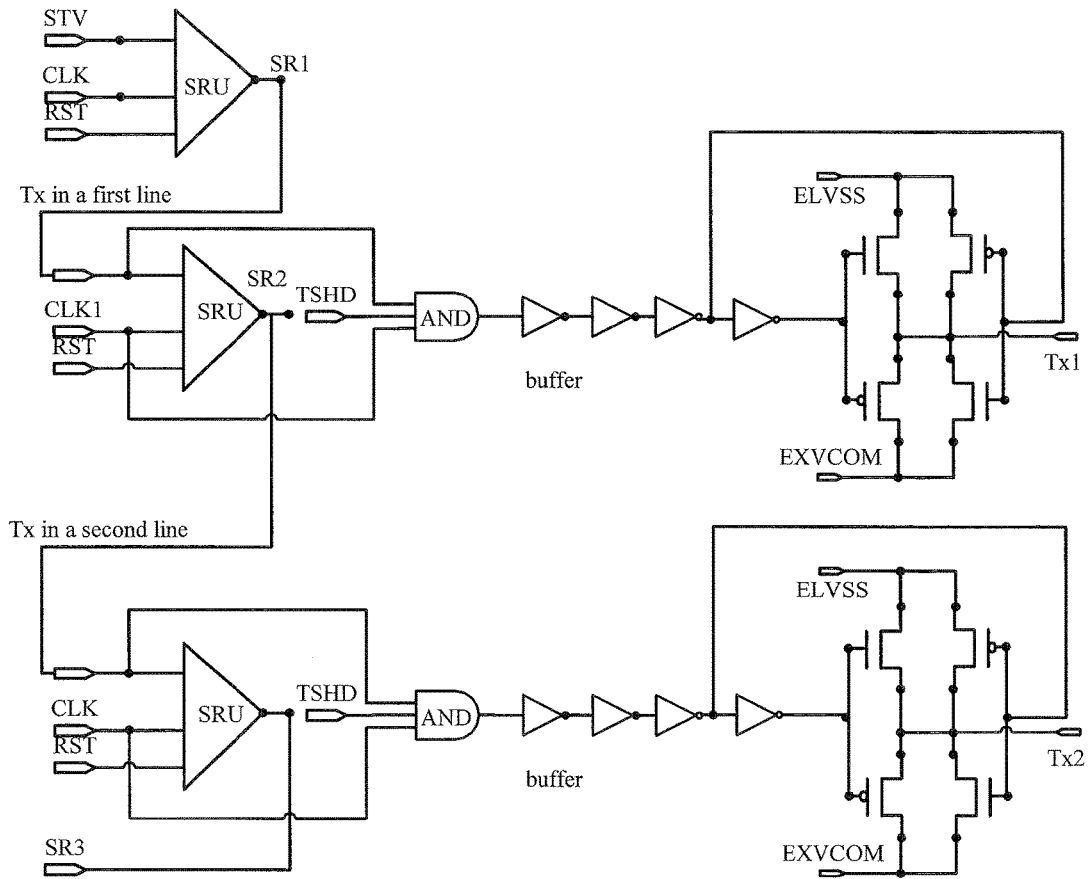
FIG. 8 is a schematic diagram illustrating a specific driving structure of a driving gate array of the touch sensor of FIG. 7.
Figure 9:
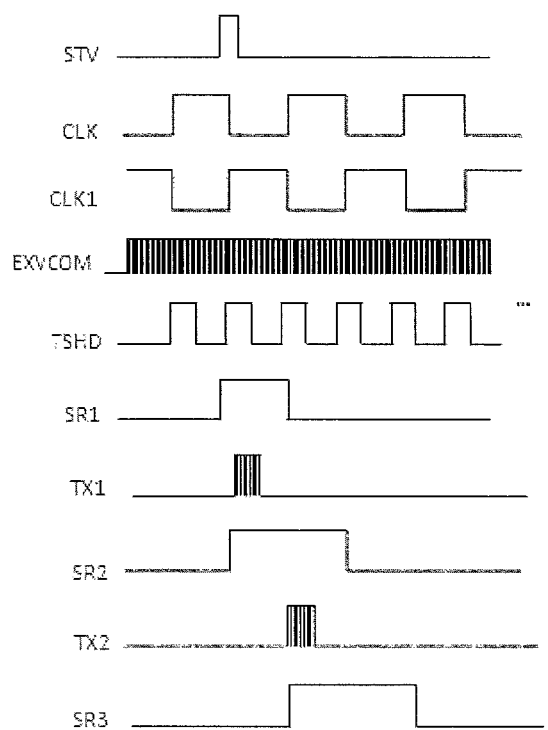
FIG. 9 is a timing diagram for a driving circuit for the touch driving electrode of the touch sensor.

FIG. 8 is a schematic diagram illustrating the specific driving structure of the driving gate array of the touch sensor of FIG. 7. In particular, it shows a driving circuit for the touch driving electrode Tx of the touch sensor. FIG. 9 is a timing diagram of the driving circuit for the touch driving electrode. In a term of timing control, the touching operation and displaying operation are operated in a time sharing manner.

In particular, a method for driving a display apparatus according to the disclosure may comprise: applying, at a displaying phase, a driving signal for displaying on the cathode or the anode, so as to drive the OLED device; and applying, at a touching phase, a driving signal for touching on the touch driving electrode, so that at least a part of the sub-cathodes are operated as touch sensing electrodes, to output a touch sensing signal.

In the following, the operation of the gate array of the driver of the touch sensor will be discussed with reference to FIGS. 8 and 9 in detail. As shown in FIG. 8, the driving gate array circuit of the touch sensor is mainly used to generate pluses for the touch driving electrode. The driving circuit of the touch driving electrode may comprise a scanning triggering signal STV, clock signals CLK and CLK1, a resetting signal RST, a touching progressive scanning signal TSHD, a pulse driving signal ELVCOM, and a cathode level signal ELVSS. As shown in FIG. 9, the principle of the driving circuit may comprise: firstly, resetting the circuit via the RST signal; inputting the STV and CLK signal into the SRU register of a dummy line; inputting a signal generated by the SRU shift register SR1 into the driving circuit of the driving electrode in a first line, as the scanning triggering signal; inputting one part of the SR1 signal to the driving electrode in a next line by a shift register, and inputting other part of the SR1 signal into a gate circuit "AND" so as to perform an "AND" operation with the TSHD and CLK1 (or CLK); then, buffering and amplifying the signal after being performed with the "AND" operation, by a buffering amplifier, and inputting the buffered and amplified signal into a transmission gate circuit; and selectively outputting the inputted signal by the transmission gate, i.e. outputting the ELVSS signal during the displaying operation and outputting the touch driving electrode signal during the touch sensing operation. By using the time sharing technology, the interacting of the displaying operation and touching operation can be prevented. Thus, the cathode, the anode and the touch sensing electrode manufactured by a simple process can be cooperated with each other.

The present disclosure has been illustrated in combination with the preferred embodiments. It is understood that those skilled in the art can make various modifications and variations to the present disclosure without departing from the spirit and scope of the present disclosure.

We claim:

1. An OLED touch panel, comprising:
   a substrate;
   a cathode and an anode, arranged on the substrate, wherein the cathode comprise a plurality of sub-cathodes; and
   a plurality of touch driving electrodes, arranged on a same layer as the anode and separated from the anode, wherein the touch driving electrode is disposed to be intersected with the sub-cathodes;
   wherein the OLED touch panel is configured to, at a displaying phase, apply a driving signal for displaying on the cathode or the anode, so as to drive an OLED device, and
   at a touching phase, apply a driving signal for touching on the touch driving electrode, so that at least a part of the sub-cathodes are operated as touch sensing electrodes, to output a touch sensing signal;
   wherein the plurality of touch driving electrodes are grouped into a plurality of groups according to a touching resolution and each group includes 5~15 touch driving electrodes connected in parallel.

2. The OLED touch panel of claim 1, wherein the OLED device comprises an OLED light emitting layer being sandwiched between the anode and the sub-cathodes.

3. The OLED touch panel of claim 1, wherein the sub-cathodes have a strip shaped structure which is perpendicular to the anode.

4. The OLED touch panel of claim 1, wherein the anode is made of an ITO material.

5. The OLED touch panel of claim 1, wherein the touch driving electrode is formed with a plurality of hollow areas.

6. The OLED touch panel of claim 5, wherein the touch driving electrode is led from an edge of a display area of the OLED device.

7. The OLED touch panel of claim 1, wherein the touch driving electrode is in a shape having slots arranged in parallel.

8. A method for manufacturing an OLED touch panel, comprising:
   forming a transistor structure on an substrate;
   forming an anode by patterning;
   forming a plurality of touch driving electrodes in the same layer as the anode, wherein the anode is separated from the touch driving electrode, wherein the plurality of touch driving electrodes are formed to be grouped into a plurality of groups according to a touching resolution and each group includes 5~15 touch driving electrodes connected in parallel;
   forming an OLED active layer on the anode of an area for an OLED device on the touch panel, wherein the anode is connected to a source/drain of the transistor structure; and
   forming a cathode comprising a plurality of sub-cathodes, wherein the cathode is insulated from the touch driving electrode by an insulation layer, and the sub-cathodes is disposed to be intersected with the touch driving electrode.

9. A display apparatus, comprising the OLED touch panel of claim 1.

10. A method for driving the display apparatus of claim 9, comprising:
- applying, at a displaying phase, a driving signal for displaying on the cathode or the anode, so as to drive the OLED device; and
- applying, at a touching phase, a driving signal for touching on the touch driving electrode, so that at least a part of the sub-cathodes are operated as touch sensing electrodes, to output a touch sensing signal.

11. A display apparatus, comprising the OLED touch panel of claim 2.

12. A display apparatus, comprising the OLED touch panel of claim 3.

13. A display apparatus, comprising the OLED touch panel of claim 4.

14. A display apparatus, comprising the OLED touch panel of claim 5.

15. A display apparatus, comprising the OLED touch panel of claim 6.

16. A display apparatus, comprising the OLED touch panel of claim 7.

* * * * *